United States Patent
Momose et al.

(10) Patent No.: US 10,772,214 B2
(45) Date of Patent: Sep. 8, 2020

(54) CIRCUIT BOARD MANUFACTURING METHOD

(71) Applicants: TOYOTA JIDOSHA KABUSHIKI KAISHA, Toyota-shi, Aichi-ken (JP); DENSO CORPORATION, Kariya, Aichi-pref (JP)

(72) Inventors: Masafumi Momose, Anjo (JP); Tetsuya Dewa, Kariya (JP)

(73) Assignees: TOYOTA JIDOSHA KABUSHIKI KAISHA, Toyota-shi, Aichi-ken (JP); DENSO CORPORATION, Kariya, Aichi-pref (JP)

( * ) Notice: Subject to any disclaimer, the term of this patent is extended or adjusted under 35 U.S.C. 154(b) by 0 days.

(21) Appl. No.: 16/679,761

(22) Filed: Nov. 11, 2019

(65) Prior Publication Data

US 2020/0154577 A1   May 14, 2020

(30) Foreign Application Priority Data

Nov. 14, 2018   (JP) .................. 2018-214119

(51) Int. Cl.

| | |
|---|---|
| *H01R 9/00* | (2006.01) |
| *H05K 3/00* | (2006.01) |
| *H05K 3/32* | (2006.01) |
| *H05K 1/18* | (2006.01) |
| *B23K 26/22* | (2006.01) |

(Continued)

(52) U.S. Cl.
CPC ............. *H05K 3/328* (2013.01); *B23K 26/22* (2013.01); *H05K 1/184* (2013.01); *H05K 1/0266* (2013.01); *H05K 7/209* (2013.01); *H05K 2201/10166* (2013.01); *H05K 2201/10303* (2013.01); *H05K 2201/10901* (2013.01); *H05K 2203/107* (2013.01); *Y10T 29/49147* (2015.01)

(58) Field of Classification Search
CPC ........ H05K 3/328; H05K 1/184; H05K 7/209; H05K 2203/107; H05K 1/0266; H05K 2201/10303; H05K 2201/10901; B23K 26/22; B23K 1/0056; H01L 23/49816; Y10T 29/49139; Y10T 29/49142; Y10T 29/49144; Y10T 29/49147; Y10T 29/49149
USPC .................. 29/832, 837, 839, 840, 842, 843
See application file for complete search history.

(56) References Cited

U.S. PATENT DOCUMENTS

| | | | | |
|---|---|---|---|---|
| 6,080,956 A | * | 6/2000 | Ueda ..................... | B23K 1/0056 219/121.63 |
| 6,228,466 B1 | * | 5/2001 | Tsukada ............ | H01L 23/49816 174/255 |
| 7,134,592 B2 | * | 11/2006 | Ensslin ................ | H05K 3/3447 228/260 |

FOREIGN PATENT DOCUMENTS

JP   2014-107424 A   6/2014

* cited by examiner

*Primary Examiner* — Donghai D Nguyen
(74) *Attorney, Agent, or Firm* — Sughrue Mion, PLLC

(57) ABSTRACT

A manufacturing method for a circuit board in which a pin inserted in a through-hole of a land is welded to the land is disclosed. The land is covered with a white layer, and an irradiation angle of a laser beam with respect to the circuit board is adjusted so that reflected light of the laser beam emitted to the pin reaches the white layer on the land. As the reflected light of the laser beam is allowed to reach a white region provided on the land, the reflected light is scattered on the white region. A rate of absorption of the laser beam by the land is decreased, and a temperature increase of the (Continued)

land is restrained. As a result, a damage of an insulating part around the land is restrained.

4 Claims, 4 Drawing Sheets

(51) Int. Cl.
*H05K 1/02* (2006.01)
*H05K 7/20* (2006.01)

CIRCUIT BOARD MANUFACTURING METHOD

INCORPORATION BY REFERENCE

The disclosure of Japanese Patent Application No. 2018-214119 filed on Nov. 14, 2018 including the specification, drawings and abstract is incorporated herein by reference in its entirety.

BACKGROUND

1. Technical Field

The disclosure relates to a manufacturing method for a circuit board and the circuit board.

2. Description of Related Art

A manufacturing method for a circuit board includes a process of inserting a pin (a terminal pin) of a component into a through-hole of a land, and welding the terminal pin to the land. The land is a part of a wiring pattern formed on a surface of the circuit board, and means a portion surrounding the through-hole. Normally, the land is wider than another portion of the wiring pattern that is intended only for conduction.

In recent years, a laser beam is used for welding. A laser beam is emitted on a solder material, and a part of the laser beam is also emitted on the terminal pin. When direct light of the laser beam and light reflected by the terminal pin (reflected light) are overlapped and emitted to an insulating part (with a dark green color in many cases) other than the wiring pattern, the insulating part can be scorched.

Japanese Unexamined Patent Application Publication No. 2014-107424 (JP 2014-107424 A) discloses a technique that prevents scorching of an insulating part due to overlap of direct light and reflected light. In the technique disclosed in JP 2014-107424 A, a shape of a distal end portion of the terminal pin, and an amount of projection of the terminal pin from the circuit board are determined so that the direct light and the reflected light are prevented from overlapping on a surface of a circuit board other than the land. With the technique described in JP 2014-107424 A, the laser beam is emitted perpendicularly on the circuit board. The laser beam is reflected by the distal end of the terminal pin.

SUMMARY

When the reflected light of the laser beam is emitted to the land, the land is heated, and the insulating part that is in contact with the land can be damaged. The specification provides a technique with which a quantity of heat received by a land from a laser beam is reduced, and a damage of an insulating part around the land is thus restrained.

In a manufacturing method for a circuit board disclosed in the specification, a terminal pin inserted into a through-hole of a land is welded to the land. In the manufacturing method disclosed in the specification, the land is covered with a white layer, and an irradiation angle of a laser beam for welding with respect to the circuit board is adjusted so that reflected light which is a light of the laser beam emitted to the terminal pin reflected by the terminal pin strikes the white layer on the land. As a white region is provided on the land, and the reflected light of the laser beam is allowed to strike the white region, the reflected light scatters on the white region. Thus, a rate of absorption of the laser beam by the land decreases, and a temperature increase of the land is restrained. As a result, a damage of an insulating part around the land is restrained.

When at least a part of the reflected light strikes the white region, the reflected light scatters, and a temperature increase of the land is restrained. The irradiation angle may be adjusted so that the reflected light does not strike the circuit board except the white layer on the circuit board. Thus, a temperature increase of the land is restrained effectively.

The irradiation angle may be adjusted so that the laser beam is emitted to a side surface of the terminal pin and also emitted to an inner surface of the through-hole. When the irradiation angle is adjusted so that the laser beam is emitted to the inner surface of the through-hole, the laser beam does not pass through the through-hole. In a case where another component is arranged on the opposite side of the circuit board, it is possible to prevent the laser beam from passing through the through-hole and striking the component.

An area of the land on a laser beam incident side with respect to the through-hole may be larger than an area of the land on an opposite side to the laser beam incident side with respect to the through-hole. This means that the area of the land may be wider on the side struck by the reflected light of the laser beam with respect to the through-hole, and the area of the land may be smaller on the side that is not struck by the reflected light with respect to the through-hole. As the area of the land is small on the side where the reflected light of the laser beam does not reach, it is possible to restrain an increase in the area of the entire land.

The specification also provides a circuit board in which no scorching happens in an insulating part around a land. In the circuit board, the land may be covered with a white layer. The white layer on the land has high reflectivity of a laser beam, and a rate of absorption of the laser beam is low, on the contrary. Thus, an increase in temperature of the land is restrained, and a damage of the insulating part around the land is restrained.

The details and further improvements of the technique disclosed in this specification are described in "Detailed Description of Embodiments" below.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
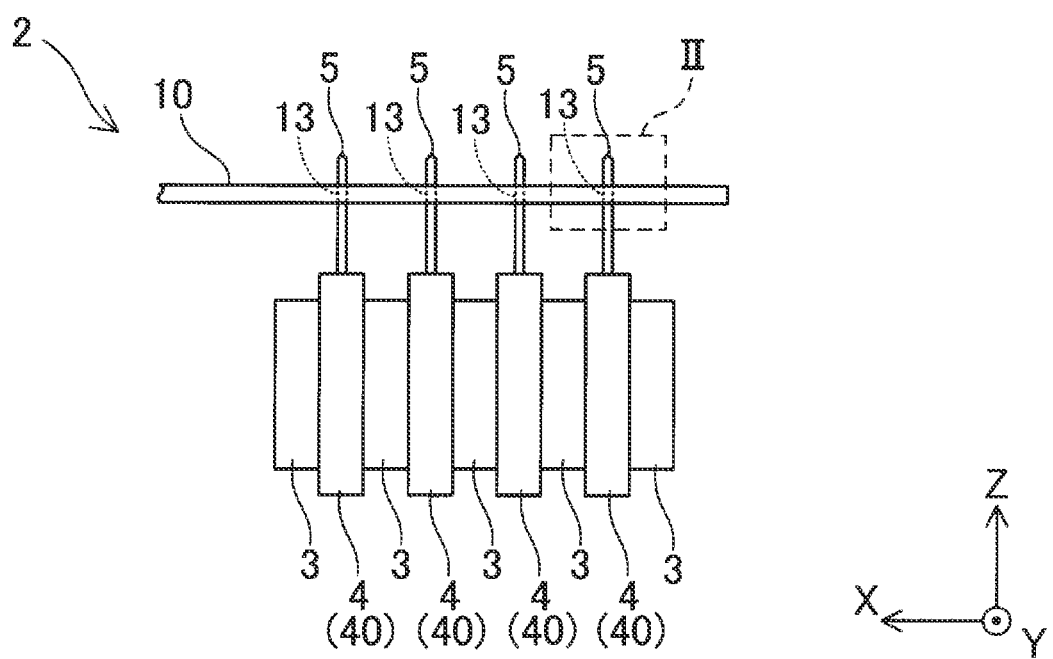
FIG. 1 is a side view of a power convertor including a semiconductor module and a circuit board.

With reference to the drawings, a circuit board and a manufacturing method for the circuit board according to an example are described. The circuit board according to the example is used in a power convertor. FIG. 1 shows a side view of the power convertor 2. FIG. 1 only shows main components of the power convertor 2, and some components such as a case and a connector are not shown. For convenience of description, a +Z direction of a coordinate system in the drawing is defined as an "upward direction".

The power convertor 2 includes a plurality of semiconductor modules 4, a plurality of coolers 3, and a circuit board 10. Each of the semiconductor modules 4 and each of the coolers 3 are laminated alternately. A power transistor is housed in a package 40 that serves as a body of the semiconductor module 4. The package 40 is made from resin. From an upper surface of each of the packages 40, a plurality of terminal pins 5 extends upward. The terminal pins 5 include a pin connected with a gate electrode of the power transistor inside the package 40, a pin connected with a sense emitter of the power transistor, a pin connected with a sensor that measures temperature of the power transistor, and so on. The terminal pins 5 in one of the semiconductor modules 4 are arrayed in one line along a Y direction of the coordinate system in the drawings. Therefore, in FIG. 1, only one of the terminal pins 5 of each of the semiconductor modules 4 is shown. In the circuit board 10, a control circuit that controls the power transistor inside the semiconductor module 4 is implemented. Description of the control circuit is omitted.

Figure 2A:
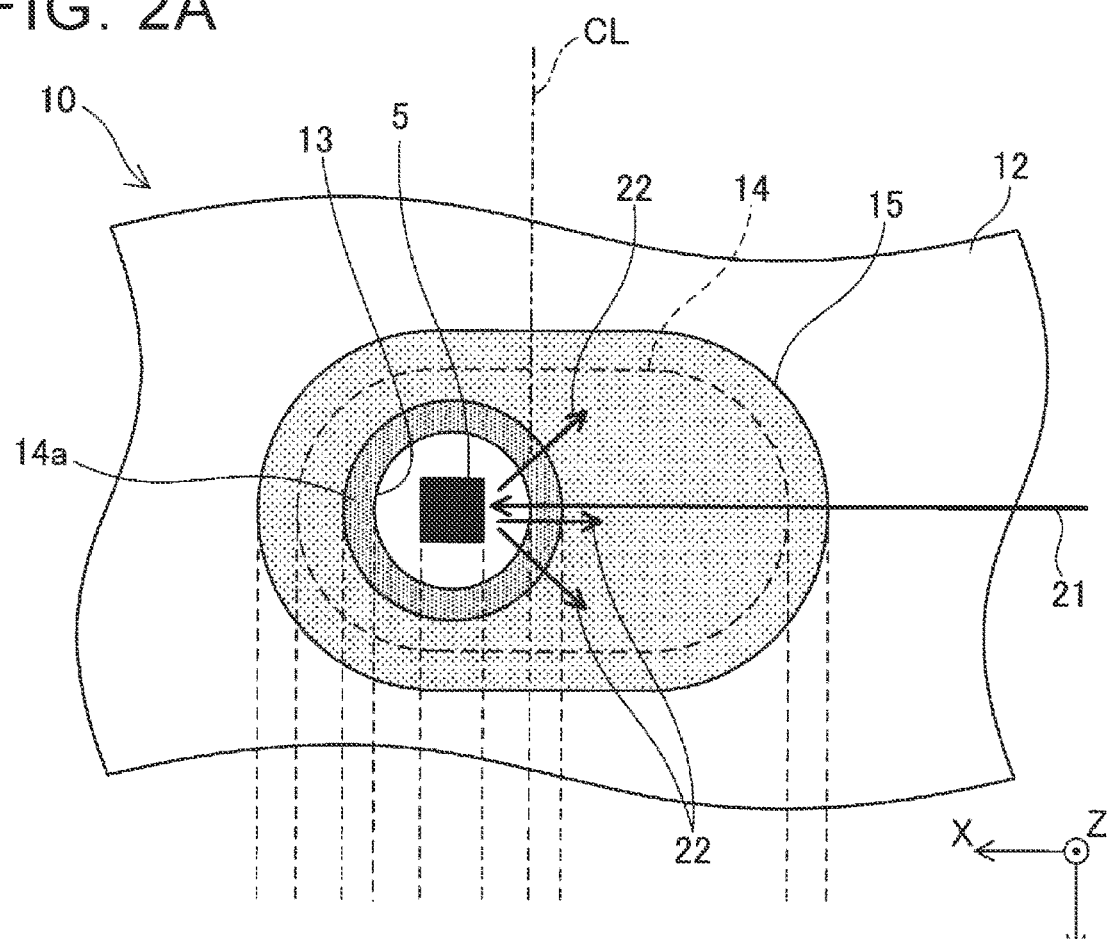
FIG. 2A is an enlarged planer view of a range shown by a broken line II in FIG. 1, seen from a normal direction of the circuit board.
Figure 2B:
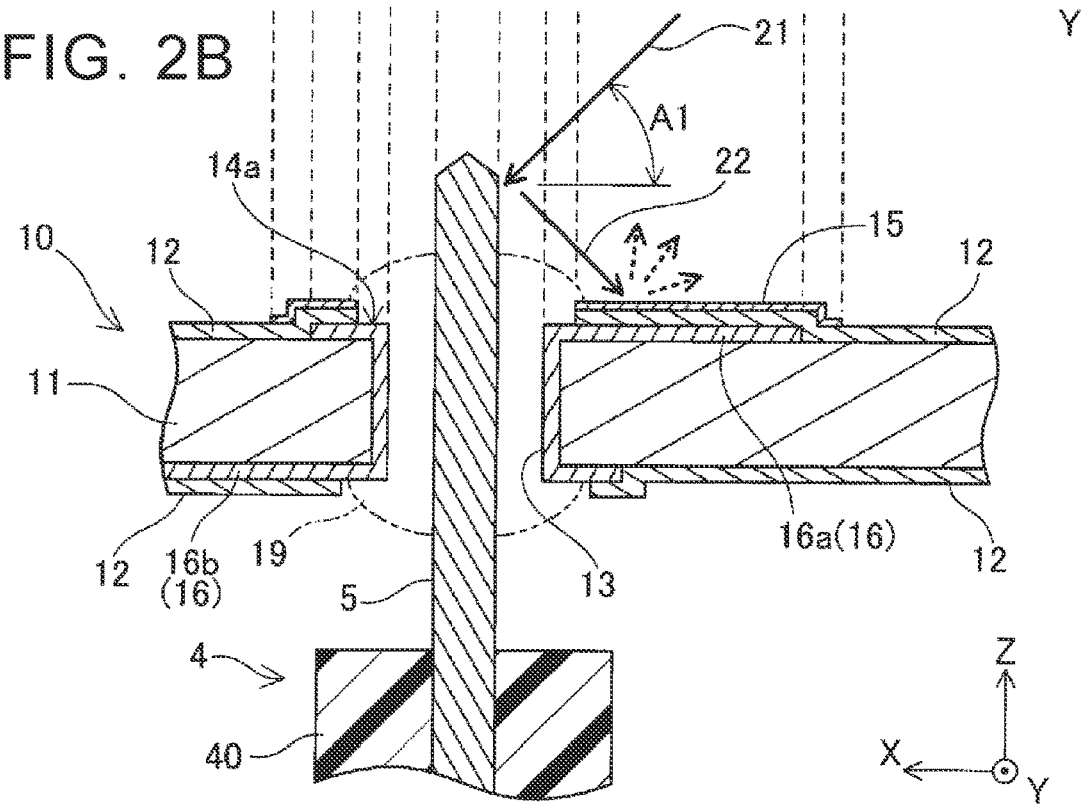
FIG. 2B is a sectional view of the range shown by the broken line II in FIG. 1.

The terminal pin 5 passes through a through-hole 13 of the circuit board 10 and is joined to the through-hole with solder. FIG. 2A is an enlarged planar view of a range of a broken line II in FIG. 1 seen in a normal direction of the circuit board 10, and FIG. 2B is a sectional view of the range of the broken line II taken along an XZ plane. FIG. 2B is a sectional view taken along a plane that passes through the through-hole 13 and the terminal pin 5.

The circuit board 10 is a plate where a wiring pattern 16 is arranged on an insulating plate 11 made from epoxy resin. The wiring pattern 16 is provided on an upper surface and a lower surface of the insulating plate 11. The wiring pattern on the upper surface is denoted by a reference numeral 16a, the wiring pattern on the lower surface is denoted by a reference numeral 16b. In reality, a wiring pattern layer is also provided in a middle of the insulating plate 11 in a thickness direction, but this wiring pattern layer is not shown. The wiring pattern 16 is a conductive layer made from metal such as copper, and is a conduction path that allows various electronic components arranged on the circuit board 10 to be electrically continuous.

The surface of the board except the wiring pattern 16 is covered with an insulating resist layer 12. In FIG. 2B, the wiring pattern 16b is exposed from the circuit board 10 on the left side of the lower surface of the insulating plate 11, and the wiring pattern 16b is connected with the electronic components at locations that are not shown.

The insulating plate 11 is provided with the through-hole 13, and a part of the wiring pattern 16 also covers an inside surface of the through-hole 13. The wiring pattern 16a on the upper surface and the wiring pattern 16b on the lower surface are electrically continuous through the through-hole 13.

The wiring pattern 16a on the upper surface of the insulating plate 11 expands so as to surround the through-hole 13, and constructs a land 14 to which the terminal pin 5 is welded. In FIG. 2A, in order to facilitate understanding, the terminal pin 5 is colored in black. Further, a region where a white silk 15 (described later) is stuck is colored with light gray, and a region where the land 14 is exposed (a land exposed region 14a) is colored with dark gray. In FIG. 2A, a white region between the black terminal pin 5 and the dark gray land exposed region 14a corresponds to the through-hole 13. As described later, the through-hole 13 is filled with solder. However, in order to facilitate understanding, the solder is not shown in FIG. 2A. An alternate long and short dash line CL in FIG. 2A shows the center of the land 14 and the silk 15 in the X direction of the coordinate system of the drawing.

The land 14 is a part of the wiring pattern 16a and a region surrounding the through-hole 13. The through-hole 13 is arranged at a position that is deviated from the center of the land 14 (the center line CL). The land 14 is wider on the −X side of the through-hole 13, and narrower on the +X side in the coordinate system of the drawing.

A manufacturing method for the circuit board 10 is described. More specifically, a step of welding the terminal pin 5 to the land 14 in the process of manufacturing the circuit board 10 is described.

In some cases, white silk is used in order to write a letter and the like on the circuit board 10. In the circuit board 10 according to the example, the white silk is used not only for writing letters, but also for covering the land 14. The white silk 15 covers the entire land 14 except the land exposed region 14a around the through-hole 13. To be more specific, the resist layer 12 covers the land 14 except the land exposed region 14a of the through-hole 13, and, at the same time, the white silk 15 covers the entire land 14 on the resist layer 12 except the land exposed region 14a. In FIG. 2A, the broken line denoted by a reference numeral 14 shows an outline of the land underneath the silk 15 and the resist layer 12.

The terminal pin 5 of the semiconductor module 4 passes through the through-hole 13, and the terminal pin 5 is joined to the through-hole 13 and the land exposed region 14a with the solder 19. In order to facilitate visibility of the drawing, the solder is not shown in FIG. 2A, and the solder 19 is shown by a virtual line in FIG. 2B.

In order to melt the solder 19 to weld the terminal pin 5 to the land 14, a laser beam for welding is used. The laser beam is emitted diagonally to a surface of the circuit board 10. In FIG. 2A and FIG. 2B, thick arrows denoted by a reference numeral 21 represent incident light (incident light 21) of the laser beam. In FIG. 2B, the laser beam (the incident light 21) is adjusted so as to be incident on the surface of the circuit board 10 at an irradiation angle A1.

When the terminal pin 5 is welded, the laser beam (the incident light 21) that is incident diagonally on the circuit board 10 directly strikes the solder 19, and a part of the laser beam also strikes the terminal pin 5. The solder 19 melts due to heat of the laser beam (the incident light 21), and the terminal pin 5 is also heated. Because temperature of the terminal pin 5 increases, the melted solder 19 is closely adhered to the terminal pin 5.

A part of the laser beam (the incident light 21) is reflected on a side surface of the terminal pin 5, and becomes reflected light 22. When the reflected light 22 is emitted on the resist layer 12, the resist layer 12 may be damaged due to energy of the laser beam. Further, when the reflected light 22 is emitted on the land according to the related art, the land is heated, and the resist layer 12 and the insulating plate 11 around the land may be damaged due to the heat. With the manufacturing method according to the example, damages of the insulating plate 11 and the resist layer 12 around the land caused by the reflected light 22 of the laser beam are reduced.

In a planar view in FIG. 2A, the incident light 21 of the laser beam is emitted in the +X direction of the coordinate system in the drawing. The through-hole 13 is arranged so as to be shifted in the X direction to the +X side in the region of the land 14. In other words, an area of the land 14 on a laser beam incident side (a side on which the incident light 21 enters) with respect to the through-hole 13 is larger than an area of the land 14 on the opposite side (the +X side) to the laser beam incident side (the side on which the incident light 21 enters) with respect to the through-hole 13.

An area of the land 14 (the silk 15) on the side reached by the reflected light 22 of the laser beam is wide, and the reflected light 22 strikes a white region (a region where the silk 15 is stuck) on the land 14. The irradiation angle A1 is adjusted so that the reflected light 22 of the laser beam strikes the white region on the land 14. Preferably, the irradiation angle A1 is adjusted so that the reflected light 22 does not strike a region other than the white region on the land 14 of the circuit board 10.

Since the reflected light 22 is reflected further (scattered) on the white region, energy of the laser beam absorbed in the land 14 is restrained. As a result, a temperature increase of the land 14 is restrained. Thus, damages of the resist layer 12 and the insulating plate 11 around the land 14 due to the heat of the land 14 are reduced. Thick broken arrows in FIG. 2B schematically show the laser beam that scatters from the white silk 15 on the land 14.

With the manufacturing method according to the example, the land 14 is covered with the white silk 15, and the irradiation angle A1 of the laser beam with respect to the circuit board 10 is adjusted so that the reflected light 22 of the laser beam emitted on the terminal pin 5 strikes the white silk 15 on the land 14. The reflected light 22 is diffused from the surface of the silk 15, and temperature increase of the land 14 is thus restrained. As a result, damages of the resist layer 12 and the insulating plate 11 around the land 14 are restrained.

Further, the area of the land 14 on the laser beam incident side (the −X side in the drawing) to the through-hole 13 is larger than the area of the land 14 on the opposite side (the +X side in the drawing) to the laser beam incident side to the through-hole 13. In the region where the reflected light 22 does not reach, the area of the land 14 is small. Therefore, it is possible to prevent the entire area of the land 14 from becoming unnecessarily large.

Figure 3:
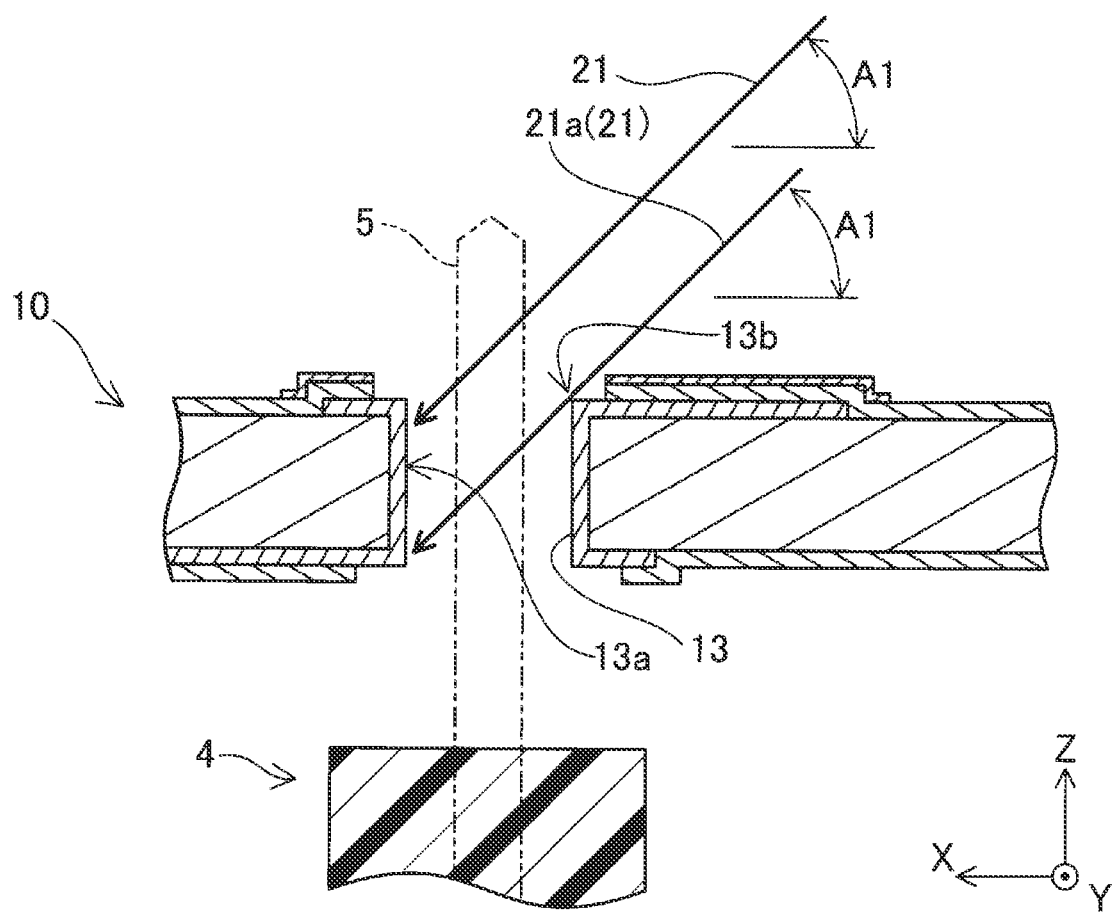
FIG. 3 is a sectional view of the range shown by the broken line II in FIG. 1 (a view in which a pin is depicted with a virtual line)

FIG. 3 shows a sectional view in which the terminal pin 5 is depicted with a virtual line. With the manufacturing method according to the example, the irradiation angle A1 of the laser beam is adjusted so that the laser beam (the incident light 21*a*) that passes an opening edge 13*b* of the through-hole 13 is emitted on an inner surface 13*a* of the through-hole 13. The opening edge 13*b* of the through-hole 13 is located on a side where the laser beam is emitted. With such an adjustment, even if the solder 19 (not shown in FIG. 3) melts down and the laser beam (the incident light) is no longer blocked by the solder, the incident light 21*a* is prevented from passing through to the other side of the circuit board 10. Even when another component (for example, the semiconductor module 4) is arranged on the other side of the through-hole 13, the laser beam (the incident light 21) does not pass through the through-hole 13. The incident light 21 passing the opening edge 13*b* becomes closest to an opening edge of the circuit board 10 on the other side. As the incident light 21*a* described above is emitted onto the inner surface 13*a* of the through-hole 13, it is ensured that the entire incident light 21 does not directly pass through the through-hole 13.

Figure 4:
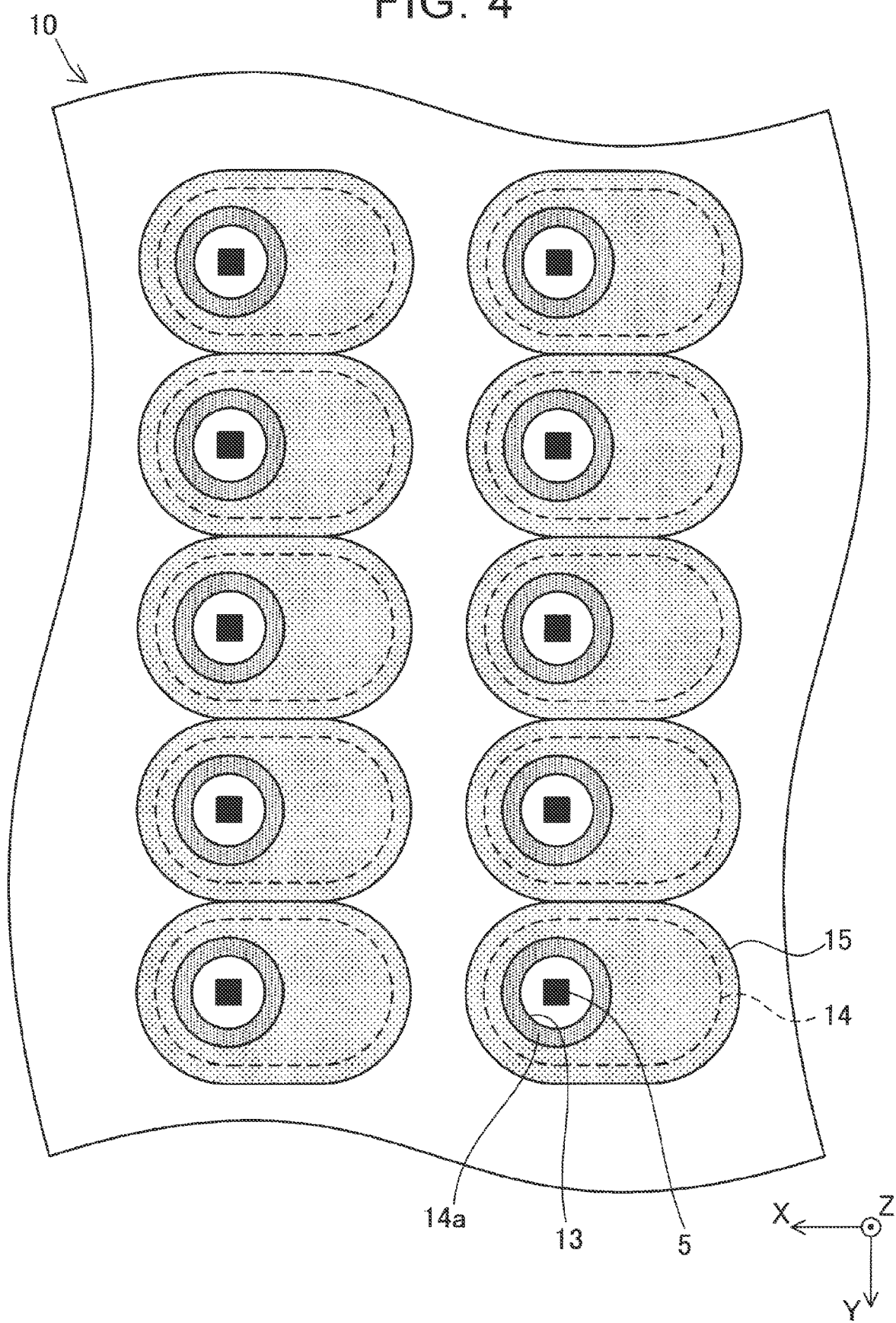
FIG. 4 is a planar view of the circuit board.

As described earlier, the terminal pins 5 extend from each of the semiconductor modules 4. FIG. 4 shows a planar view of a range of the circuit board 10 wider than the range shown in FIG. 2A. In FIG. 4, reference numerals are given to the terminal pin 5, the through-hole 13, the land 14, and the silk 15 on the right bottom only, and reference numerals of the remaining terminal pins and so on are omitted. In FIG. 4, in order to facilitate understanding, the terminal pin 5 is colored with black, and a region where the white silk 15 is stuck is colored with light gray. Further, a region where the land 14 is exposed (the land exposed region 14*a*) is colored with dark gray. A white region between the black terminal pin 5 and the dark gray land exposed region 14*a* represents the through-hole 13. Although the through-hole 13 is filled with the solder, the solder is not shown in FIG. 4 either.

FIG. 4 shows 10 terminal pins 5, and the lands 14 corresponding to the terminal pins 5, respectively. The five terminal pins 5 and the five lands 14 are arrayed in one line in the Y direction of a coordinate system of the drawing. The remaining five terminal pins and the five lands 14 are also arrayed in one line in the Y direction. In the through-holes 13 and the lands 14 corresponding to the through-holes 13, respectively, each of the through-holes 13 is provided at a position shifted in the same direction with respect to the corresponding land 14. With this kind of arrangement, when the laser beam is emitted from the same direction at the same irradiation angle, it is possible to allow the reflected light to reach the top of the white silk 15 on each of the lands 14. This means that, without changing an incident direction of a laser beam light source, the terminal pins are welded while a damage of the insulating layer around the land is being restrained.

In this specification, the circuit board 10 is also provided in which the insulating part (the resist layer 12 or the insulating plate 11) around the land has less damage. In the circuit board 10, the terminal pin 5 that passes through the through-hole 13 is joined to the land 14 around the through-hole 13. The land 14 is covered with the white silk 15.

Notes are given regarding the technique disclosed in the specification. Instead of covering the land with the white silk, white paint may be applied on the land. Alternatively, a white resist layer may cover the land. The white layer covers the land except a periphery of the through-hole (the land exposed region). A dark colored resist layer may cover the land except the periphery of the through-hole (the land exposed region), and white paint may be applied on the resist layer.

The "white color" in the specification includes a pale cream color.

Specific examples of the disclosure have been explained in detail, but are examples only, and do not limit the scope of the claims. The techniques described in the scope of the claims include various modifications and changes of the specific examples described above. The technical elements described in this specification and the drawings achieve technical utility alone or as various combinations, and are not limited to the combinations described in the claims on filing. Moreover, the techniques described as examples in the specification or the drawings are able to achieve a plurality of objectives simultaneously and have technical utility by achieving one of the objectives.

What is claimed is:

1. A manufacturing method for a circuit board, comprising:
   welding a terminal pin to a land, the terminal pin being inserted in a through-hole of the land, wherein:
   the land is covered with a white layer; and
   an irradiation angle of a laser beam for welding with respect to the circuit board is adjusted so that reflected light which is a light of the laser beam emitted to the terminal pin reflected by the terminal pin strikes the white layer on the land.

2. The manufacturing method according to claim 1, wherein the irradiation angle is adjusted so that the reflected light does not strike the circuit board except the white layer.

3. The manufacturing method according to claim 1, wherein the irradiation angle is adjusted so that the laser beam is emitted to a side surface of the terminal pin and also emitted to an inner surface of the through-hole.

4. The manufacturing method according to claim 1, wherein an area of the land on a laser beam incident side with respect to the through-hole is larger than an area of the land on an opposite side to the laser beam incident side with respect to the through-hole.

* * * * *